United States Patent
Su et al.

(10) Patent No.: US 11,934,743 B2
(45) Date of Patent: Mar. 19, 2024

(54) METHOD FOR MEASURING THE SURFACE SHAPE OF A TORIC MIRROR

(71) Applicant: MLOptic Corp, Redmond, WA (US)

(72) Inventors: Zhide Su, Nanjing (CN); Zhiping Song, Nanjing (CN)

(73) Assignee: MLOptic Corp., Redmond, WA (US)

(*) Notice: Subject to any disclaimer, the term of this patent is extended or adjusted under 35 U.S.C. 154(b) by 304 days.

(21) Appl. No.: 17/548,912

(22) Filed: Dec. 13, 2021

(65) Prior Publication Data

US 2023/0063166 A1  Mar. 2, 2023

(51) Int. Cl.
  *G06F 30/10* (2020.01)
  *G01B 11/25* (2006.01)
  *G06F 30/20* (2020.01)

(52) U.S. Cl.
  CPC .......... *G06F 30/10* (2020.01); *G01B 11/2522* (2013.01); *G06F 30/20* (2020.01)

(58) Field of Classification Search
  CPC .......... G06F 30/10; G06F 30/20; G01B 21/20; G01B 11/2522; G01B 21/04
  See application file for complete search history.

(56) References Cited

U.S. PATENT DOCUMENTS

| 2010/0271405 A1* | 10/2010 | Schneider | G06F 30/00 703/1 |
| 2012/0154820 A1* | 6/2012 | Ono | G01B 11/24 356/601 |
| 2015/0120232 A1* | 4/2015 | Oota | G06T 7/33 702/97 |

FOREIGN PATENT DOCUMENTS

| CN | 201576308 U | * | 9/2010 | |
| CN | 103377303 A | * | 10/2013 | ............ G01B 21/20 |
| DE | 102010048106 A1 | * | 4/2012 | ............ G01B 21/04 |
| EP | 1055138 A2 | * | 11/2000 | ....... B29D 11/00019 |
| JP | H05223540 A | * | 8/1993 | |
| JP | H08240417 A | * | 9/1996 | |
| JP | H09168957 A | * | 6/1997 | |
| JP | 2011095239 A | * | 5/2011 | ............ G01B 11/24 |

* cited by examiner

*Primary Examiner* — Michael P Stafira

(74) *Attorney, Agent, or Firm* — Jong Patent Firm; Cheng Ning Jong; Tracy P. Jong

(57) ABSTRACT

The invention discloses a toric mirror surface shape measurement method. The measurement method is as follows: first, according to the parameter information of the toric mirror to be measured, using three-dimensional modeling software, establish a CAD model of the toric mirror to be measured and then import the CAD model into the three-coordinate machine software, based on the three-coordinate machine to measure and construct the geometric characteristics of the solid toric mirror, establish the workpiece coordinate system, which is consistent with the CAD model coordinate system. Finally, use the three-coordinate machine to perform scanning measurements to the solid toric mirror and compare the scanning result with the theoretical value to obtain the measurement result data. The measurement method of the present invention is based on the three-coordinate measurement technology and has the advantages of strong operability and high measurement accuracy.

8 Claims, 4 Drawing Sheets

Segmented toric mirror

METHOD FOR MEASURING THE SURFACE SHAPE OF A TORIC MIRROR

PRIORITY CLAIM AND RELATED APPLICATIONS

This non-provisional application claims the benefit of priority from Chinese Pat. App. No. 2021110159137 filed on Sep. 1, 2021. Said application is incorporated by reference in its entirety.

BACKGROUND OF THE INVENTION

1. The Field of the Invention

The invention relates to a method for measuring the surface shape of a toric mirror.

2. Background Art

A toric surface, also known as a tire surface, is an optical curved surface similar to the shape of a tire. The curved surface has two different radius of curvature values on two mutually perpendicular cross-sectional circles. In optical systems, toric surfaces have unique uses, such as, as anamorphic optical elements in anamorphic optical systems, or as scanning elements in infrared thermal imaging cameras. In extreme ultraviolet spectrometers, toric mirrors are used as front mirrors to collect greater luminous flux. The mathematical expression of a toric mirror is as follows: Set the intersection line of the two mutually perpendicular symmetry planes of the toric surface as the X-axis (optical axis), and the curvature radii of the two arcs in the symmetrical section are R1 and R2 respectively. The general equation can be expressed as:

$$(x - R1)^2 + y^2 + z^2 + (R1 - R2)^2 - R2^2 = 2(R1 - R2)\sqrt{(x - R1)^2 + y^2}$$

or $$x = R1 - R1\left\{1 - \frac{y^2 + z^2}{R1^2} + \frac{2R2}{R1} * \left(\frac{R2}{R1} - 1\right)\left[1 - (1 - z^2/R2^2)^{1/2}\right]\right\}^{1/2}$$

It is difficult to test the surface shape of a toric mirror. The main reason is that it does not have rotational symmetry. The vector height of each vector point on the surface is different, so it cannot be directly measured with a spherical interferometer. Since there is no rotational symmetry axis, it is also impossible to use the compensation inspection method based on the lens group to make the measurement. There are no aberration-free points on toric surfaces, so the traditional knife-edge shading method or star point inspection method cannot be used for surface shape inspection. Therefore, there is still a lack of effective means to measure the surface shape of the toric surface. In practice, the profilometer measurement method is usually used to select a line on the toric mirror for measurement and evaluate the surface shape error of the toric surface based on the line data. This method has low accuracy and can only be used for qualitative analysis.

SUMMARY OF THE INVENTION

According to the toric mirror surface measurement method of the present invention, the measurement method is as follows: first, according to the parameter information of the toric mirror to be measured, the Computer-Aided Design (CAD) model of the toric mirror to be measured is established by using three-dimensional modeling software. The CAD model is then imported into the coordinate measuring machine (CMM) software and the workpiece coordinate system is established based on the geometric characteristics of the toric mirror consistent with the CAD model coordinate system. Finally, the three-coordinate measuring machine is used to perform scanning measurement on the toric mirror and the scanning result is compared with the theoretical value to obtain the measurement result data. The method also includes a data processing step. The data processing step includes using data processing software to perform anti-tilt processing on the obtained axial difference data, so as to obtain the surface error distribution of the toric mirror to be measured. When measuring with the method of the present invention, the CAD model of the toric sub-mirror is used as the theoretical value of the toric mirror to be measured. By comparing the measurement result with the theoretical value of the digital analogue, the surface shape error value of the toric mirror to be measured is obtained. The data obtained often contains tilt error and eccentricity error and therefore further processing of the data is needed to obtain a more realistic surface error distribution.

The above-mentioned toric mirror surface shape measurement method specifically includes the following steps:

(a) Modeling the toric mirror to be measured. The radii of curvature of the two curved surfaces of the toric mirror to be measured are R1 and R2 and the corresponding axes of the two curved surfaces are perpendicular to each other. In the 3D modeling software, a circular arc line with a radius of R2 is constructed. The arc line 360° is rotated around the axis of distance R1 to obtain the CAD model of the toric mirror according to the size of the toric mirror to be measured. The CAD model is stretched and cut in the 3D modeling software to obtain the CAD model of the toric sub-mirror;

(b) Taking the geometric center point of the toric sub-mirror as the coordinate origin and establishing a new coordinate system and outputting the toric sub-mirror CAD model in this new coordinate system, importing the toric sub-mirror CAD model into the coordinate machine software, establishing the workpiece coordinate system based on the geometric characteristics of the solid toric mirror measured by the machine based on the three coordinates and making the workpiece coordinate system consistent with the coordinate system of the CAD model;

(c) According to the CAD model of the toric sub-mirror, using a three-coordinate machine to scan and measure the surface of the solid toric mirror to obtain the X, Y, Z data and the $\Delta X$, $\Delta Y$, and $\Delta Z$ data obtained by comparison with the toric sub-mirror CAD model;

(d) Using the data processing software to perform a two-dimensional plane fitting to the obtained axial data $\Delta Z$ and to subtract the fitting plane from $\Delta Z$, and displaying the graph to obtain the surface error distribution of the toric mirror to be measured.

In step (a), the CAD model of the toric sub-mirror is constructed using the following steps:

(i) The length of the toric mirror to be measured is H, the width of the toric mirror is W and the thickness from the geometric center of the toric mirror to the bottom surface is d. In the 3D modeling software, first, a vertical line is drawn to pass the coordinate origin O. A straight line L1 and an arc with a radius of R2 on the side of L1 are drawn. The center O1 of the arc is on the same horizontal line as the origin of the coordinate. The height of the arc in the vertical direction is greater than the height dimension H of the toric mirror. The length of the center point from the coordinate origin O is the radius of curvature R1 of the toric mirror in the other direction;

(ii) Construct the profile of the toric mirror: draw the profile outer line on the outside of the arc, the distance from the geometric center of the toric mirror to the profile outer line is greater than the thickness d of the toric mirror and connect the end points on both sides of the arc to the profile outer line to form a closed section;

(iii) Select the rotating boss function, take the line L1 as the rotation axis and take the profile obtained in step (ii) as the rotated profile and rotate 360° to obtain the CAD model of the toric mirror;

(iv) Before making a drawing based on the reference plane, draw a rectangle, the height of the rectangle is H and the width is W. Select the stretching and cutting function of the modeling software to obtain the initial model of the toric sub-mirror;

(v) Create a new coordinate system denoted as coordinate system 1. Coordinate system 1 takes the geometric center of the toric sub-mirror as the coordinate origin O2 and uses the two right-angled sides of the toric sub-mirror as the X-axis and Y-axis directions. Establish a new datum plane marked as datum plane 1, datum plane 1 is parallel to the XY axis plane of coordinate system 1 and the distance between datum plane 1 and the geometric center of the toric sub-mirror is d. Draw a rectangular diagram on datum plane 1 where the length of the rectangle is H, the width is W and the CAD model is stretched and cut. The stretching method is selected as the function of penetrating the entire surface, so as to obtain the bottom plane of the toric sub-mirror so that the CAD model of the toric sub-mirror can be established. In step (i), the 3D modeling software is SolidWorks 3D® modeling software.

In step (b), the toric mirror to be measured is placed on the measuring platform of the coordinate machine before a new measurement program is created in the coordinate machine software. The CAD model of the toric sub-mirror is imported into the measurement program and the toric mirror to be measured is used. The side and center point characteristics of the curved mirror are used to construct the workpiece coordinate system. The X and Y axes of the workpiece coordinate system are parallel to the two sides of the toric mirror to be measured and the origin of the workpiece coordinate system is the geometric center point of the toric mirror to be measured. The workpiece coordinate system is consistent with the coordinate system of the toric sub-mirror CAD model;

In step (c), select the scan-curved surface scan function in the operating software of the coordinate machine. In the toric sub-mirror CAD model, select a circle of vector points along the boundary line of the curved surface to set the scanning measurement area According to the size of the toric surface to be measured, set the scan step and scan interval to generate a scan trajectory and perform automatic scan measurement in the automatic measurement mode. After the scan measurement is completed, the measurement results of all measured vector points are obtained, the position information of the measurement points is obtained and position parameters are evaluated and obtained, the position parameters including the X, Y, and Z data of the measuring vector points and the ΔX, ΔY and ΔZ after comparison with the theoretical value.

In step (d), the data processing software is Matlab® data processing software, and Matlab® data processing software is used for data processing and graphic display. The data fitting toolbox of Matlab® software is used to fit the measurement data obtained in step (c) to a two-dimensional plane of the ΔZ data to obtain the fitting plane P and Diff=ΔZ−P is taken to obtain the amount of tilt removed. The surface shape difference data Diff is displayed in a three-dimensional drawing to obtain the surface shape error distribution of the toric mirror to be measured.

An object of the present invention is to provide a surface shape measurement method with high measurement accuracy and capable of measuring the full-aperture mirror surface shape of a toric mirror.

PARTICULAR ADVANTAGES OF THE INVENTION

Compared with the prior art, the present invention has significant advantages. The measurement method of the present invention is based on the three-coordinate measurement technology, first establishing the CAD model of the toric mirror to be measured, thereby obtaining the theoretical value of the toric mirror. Based on this model, a three-coordinate machine is used to scan and measure the toric mirror surface and finally the scanning result is compared with the theoretical value to obtain the surface error distribution of the toric mirror to be measured. The present method yields strong operability and high measurement accuracy.

DETAILED DESCRIPTION OF A PREFERRED EMBODIMENT

Figure 1:
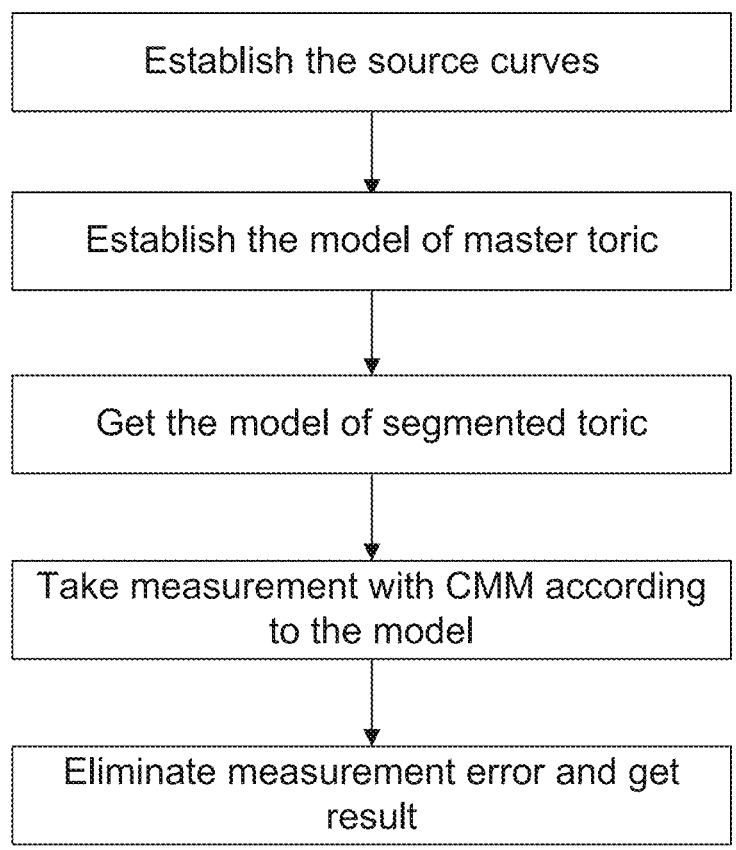
FIG. 1 is a flow chart of the method for measuring the toric mirror surface of the present invention.
Figure 2:
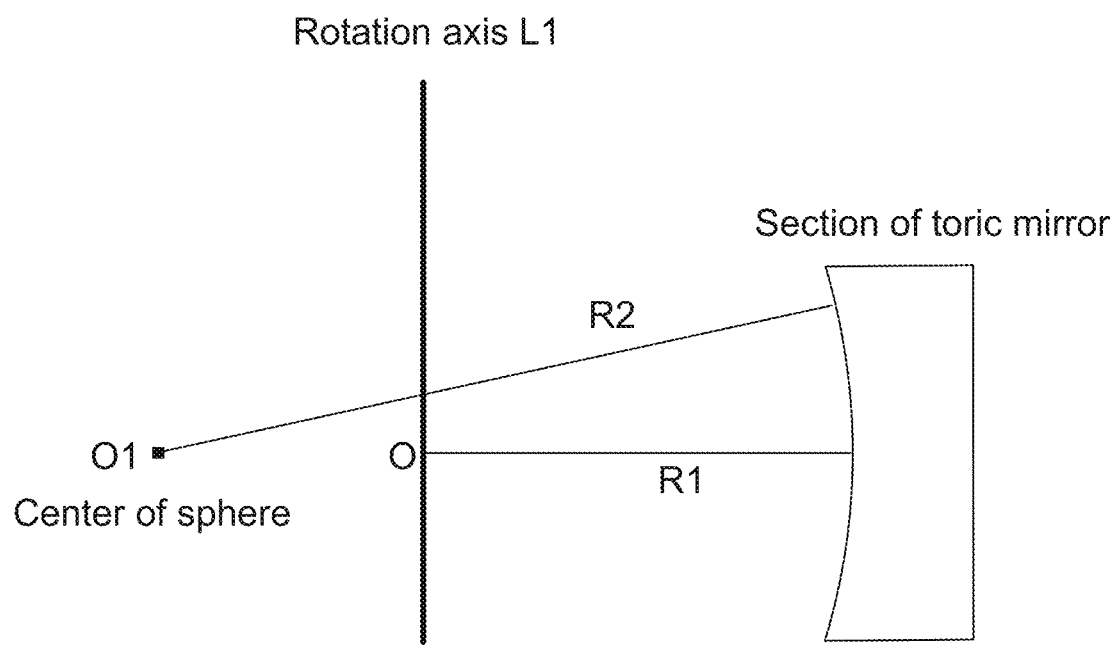
FIG. 2 is a profile view of the toric mirror before the rotation feature, the radius of curvature of the arc is R2 and the distance between the midpoint of the arc and the rotation axis L1 is R1.
Figure 3:
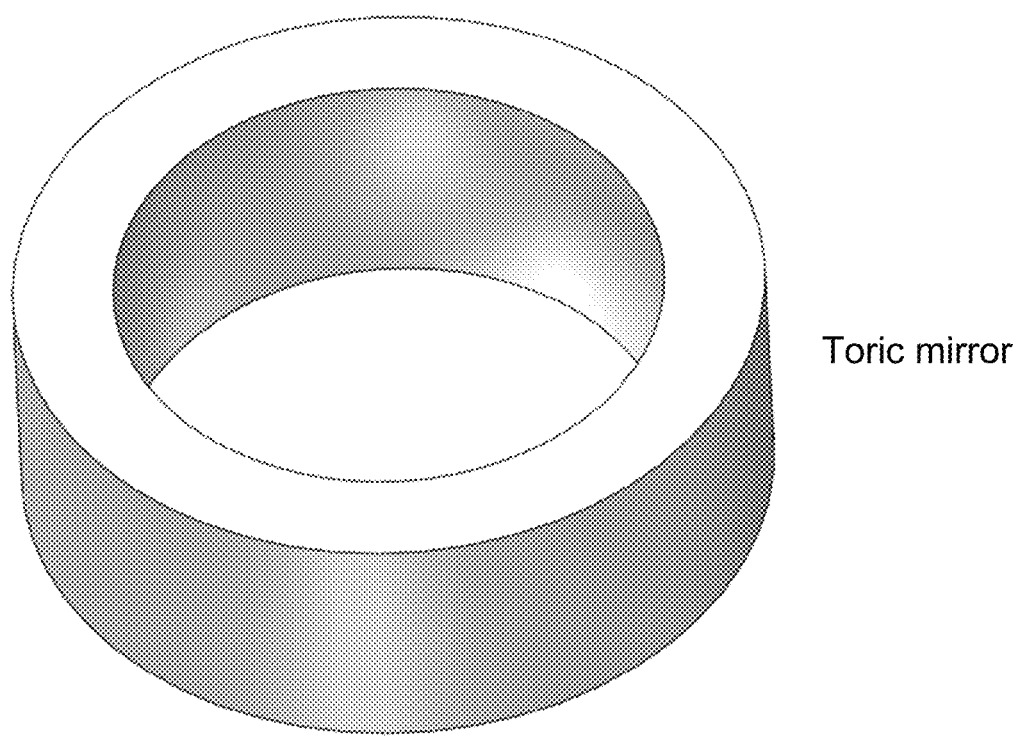
FIG. 3 shows a CAD model of the toric mirror after rotating the feature.
Figure 4:
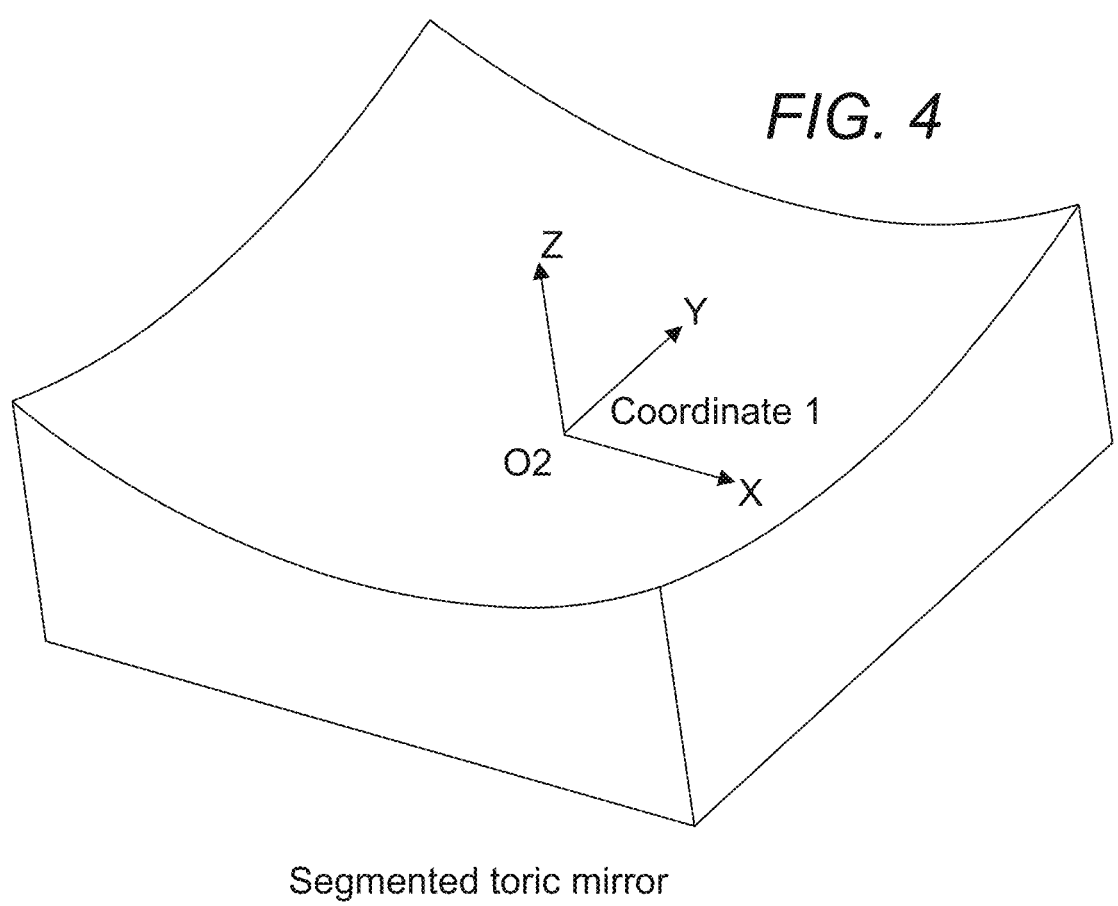
FIG. 4 is a CAD model of the toric sub-mirror with the coordinate origin O2 in the coordinate system 1 established at the geometric center point of the toric mirror.

The toric mirror to be measured of the present invention is a part cut from the toric parent mirror that is rotated. Therefore, in practice, it is necessary to first establish a CAD model of the toric parent mirror and then select from the toric parent mirror through a fixed area to obtain the CAD model of the toric sub-mirror. As shown in FIG. 1, the method for measuring the toric mirror surface of the present invention specifically includes the following steps:

(a) Build the CAD model of the toric sub-mirror, specifically:

(i) Suppose the radius of curvature of the toric mirror in one direction is R1 and the radius of curvature perpendicular to the direction is R2, the geometric size of the solid toric mirror is H×W×d and H represents the length of the toric mirror, W represents the width dimension of the toric mirror and d represents the thickness of the geometric center of the toric mirror from the bottom surface. This embodiment uses an H×W rectangular toric mirror for illustration and the method of the present invention is also applicable to toric mirrors of other shapes;

(ii) In the Solidworks 3D® modeling software, select the right-view datum plane and draw a vertical straight line L1 passing through the coordinate origin O and draw an arc with a radius of R2 on the L1 side, the center of the arc O1 and the coordinate origin O. On the same horizontal line, the height of the arc in the vertical direction must be greater than the length dimension H of the toric mirror and the distance between the midpoint of the arc and the coordinate origin O is the radius of curvature of the toric mirror in the other direction R1;

(iii) Establish the CAD model of the toric mirror: construct the profile of the toric mirror to form a closed section as shown in FIG. 2. The distance from the geometric center of the toric mirror to the outer line of the section must be greater than the thickness d of the solid mirror. Select the rotating boss function and take the straight line L1 as the rotation axis, rotate the toric mirror section 360° around the rotation axis L1 to obtain the CAD model of the toric mirror parent mirror as shown in FIG. 3;

(iv) Intercept the CAD model of the toric sub-mirror to be measured: take the datum plane as the reference plane and draw a rectangle. The length of the rectangle is H and the width W. Select the stretching and cutting function to obtain the initial model of the toric sub-mirror. Create a new coordinate system, mark it as coordinate system 1. The new coordinate system takes the geometric center of the toric mirror as the coordinate origin O2 and the two right-angled sides of the toric mirror as the X-axis and Y-axis directions. Establish a new datum plane as reference plane 1, which is parallel to the XY plane of the new coordinate system and the vertical distance from the geometric center point of the toric sub-mirror is d. Draw a rectangle on the reference plane 1, the size of the rectangle is slightly larger than the toric sub-mirror. To obtain the bottom plane of the toric sub-mirror, the CAD model of the toric sub-mirror is established. The model is shown in FIG. 4.

(b) According to the CAD model of the toric sub-mirror, the three-coordinate machine is used to measure to obtain the measurement data. The steps are as follows:

(i) Save the CAD model as a graphics file in the IGS mode. In the process of saving as IGS mode, select the coordinate system to be output as coordinate system 1 so as to obtain the CAD model of the toric sub-mirror that can be recognized by the three-coordinate machine software; (ii) Place the solid toric mirror to be measured on the measurement platform of the three-coordinate machine. Create a new measurement program in the three-coordinate machine software and import the CAD model of the toric sub-mirror into the measurement program. The three-coordinate machine uses the solid toric mirror. The side and center point features are used to construct the workpiece coordinate system. The X and Y axes of the workpiece coordinate system are parallel to the two sides of the solid toric mirror. The origin of the workpiece coordinate system is the geometric center point of the solid toric mirror. The coordinate system of the workpiece coordinate system is the same as the coordinate system of the CAD model;

(iii) In the operating software of the three-coordinate machine, select the scan-curved surface scan function. In the toric sub-mirror CAD model, select a circle of vector points along the boundary line of the curved surface to set the scanning measurement area. According to the size of the toric mirror to be measured, set the scan step and scan interval, generate a scan trajectory and carry out automatic scan measurement in the automatic measurement mode;

(c) Process the data to obtain the surface error results, the steps are as follows:

(i) After the scanning measurement is completed, the software obtains the measurement results of all measured vector points, evaluates the position information of the measurement points and obtains the position parameters of each measurement point including the X, Y and Z data of the measured vector points. After comparing the theoretical values of $\Delta X$, $\Delta Y$, $\Delta Z$, export the evaluation result as an Excel® or txt file;

(ii) Use Matlab® data processing software for data processing and graphic display. In Matlab® software, import the measurement data obtained by the coordinate machine (including the X, Y, Z data of the measured vector point and the $\Delta X$, $\Delta Y$, $\Delta Z$) using the data fitting toolbox that comes with the software, do a two-dimensional plane fitting to the $\Delta Z$ data to get the fitting plane P, take Diff=$\Delta Z$−P, get the surface difference data with Diff with the amount of tilt removed and make a three-dimensional drawing display to obtain the surface error distribution of the toric mirror to be measured.

What is claimed herein is:

1. A method for measuring the surface shape of a toric mirror, said method comprising:

(a) establishing a Computer-Aided Design (CAD) model of the toric mirror using three-dimensional (3D) modeling software according to parameter information of the toric mirror, wherein said establishing step comprises modeling the toric mirror, the curvature radii of two curved surfaces of the toric mirror are R1 and R2, the corresponding axes of the two curved surfaces are perpendicular to each other, a circular arc with a radius of R2 is constructed in a 3D modeling software, the circular arc is rotated 360° around the axis of a distance of R1 to obtain the CAD model of the toric mirror according to the size of the toric mirror and stretching and cutting the toric mirror in the 3D modeling software to obtain the CAD model of the toric sub-mirror;

(b) importing the CAD model into a three-coordinate machine software based on a three-coordinate machine to measure and construct geometric characteristics of the toric mirror;

(c) establishing the workpiece coordinate system consistent with the CAD model coordinate system, wherein said step (b) and said establishing step of said step (c) comprise taking the geometric center point of the toric sub-mirror as the coordinate origin, establishing a new coordinate system and outputting the toric sub-mirror CAD model in the new coordinate system, importing the toric sub-mirror CAD model into the three-coordinate machine software based on the three-coordinate machine system, measuring the geometric characteristics of the solid toric mirror using the three-coordinate machine, establishing the workpiece coordinate system and the workpiece coordinate system is consistent with the coordinate system of the CAD model;

(d) performing scanning measurement on the toric mirror using the three-coordinate machine to yield a scanning result and to measure the surface of the toric mirror to obtain the X, Y, Z data and the ΔX, ΔY and ΔZ data by comparison with the toric sub-mirror CAD model and performing a two-dimensional plane fitting to the ΔZ data using a data processing software and subtracting the fitting plane from the ΔZ data and displaying a graph of surface difference data to obtain the surface error distribution of the toric mirror; and (e) comparing said scanning result with theoretical values to obtain measurement result data.

2. The method according to claim 1, further comprising performing anti-tilt processing on an obtained axial difference data to obtain the surface error distribution of the toric mirror.

3. The method according to claim 1, wherein said establishing step of said step (a) comprises:

(4.1) drawing a vertical line passing through the coordinate origin O, a straight line L1, and an arc with a radius of R2 on the side of the straight line L1 in the 3D modeling software, wherein the length of the toric mirror is H, the width of the toric mirror is W, the thickness from the geometric center of the toric mirror to the bottom surface is d, the center O1 of the arc is on the same horizontal line as the coordinate origin O, the height of the arc in the vertical direction is greater than the length of the toric mirror H, the length of the center point from the coordinate origin O is the radius of curvature R1 of the toric mirror;

(4.2) constructing the profile of the toric mirror by drawing the profile outer line on the outside of the arc, the distance from the geometric center of the toric mirror to the profile outer line is greater than the thickness d of the toric mirror and the end points on both sides of the arc are respectively connected to the profile outer line to form a closed section;

(4.3) selecting the function of rotating boss and rotating 360° the profile obtained in the step (4.2) as the rotated profile to obtain the CAD model of the toric mirror about the straight line L1;

(4.4) drawing a rectangle, the length of the rectangle is H, the width is W and selecting the stretching and cutting function of the modeling software to obtain an initial model of the toric sub-mirror; and (4.5) creating a new coordinate system, wherein the new coordinate system takes the geometric center of the initial model of the toric sub-mirror as the coordinate origin O2 and using the two right-angled sides of the toric sub-mirror as the X-axis and Y-axis directions, establishing a new datum plane as reference surface 1, the reference surface 1 is parallel to the XY axes plane of the reference surface 1 and the vertical distance between the reference surface 1 and the geometric center of the toric sub-mirror is d, drawing a rectangular diagram on reference surface 1, the length of the rectangle is H, the width of the rectangle is W and stretching and cutting the rectangular diagram to obtain the bottom plane of the toric sub-mirror to establish the CAD model of the toric sub-mirror.

4. The method according to claim 3, wherein the 3D modeling software is SolidWorks® 3D modeling software.

5. The method according to claim 1, wherein in said step (b) and said establishing step of said step (c), the toric mirror is placed on a coordinate machine measuring platform before a new coordinate system is created in the three-coordinate machine software, the CAD model of the toric sub-mirror is imported into the coordinate machine measuring platform, the workpiece coordinate system is constructed using the side and center point features of the toric mirror, the X and Y axes of the workpiece coordinate system are parallel to the two sides of the toric mirror and the origin of the workpiece coordinate system is the geometric center point of the toric mirror, the workpiece coordinate system is consistent with the coordinate system of the toric sub-mirror CAD model.

6. The method according to claim 1, wherein in said step (d), a scanning-curved surface scanning function is selected in the three-coordinate machine software and in the toric sub-mirror CAD model, a circle of vector points is selected along the boundary of the curved surface to set the scanning measurement area to produce scanning results, a scanning step and a scanning interval are set according to the size of the toric mirror to generate the scanning trajectory, automatic scanning measurement is carried out in an automatic scanning mode, said measured vector points comprise the X, Y, Z data of the measured vector points and ΔX, ΔY, ΔZ obtained after a comparison of the scanning result with the theoretical values.

7. The method according to claim 1, wherein in the second performing step of said step (d), the data processing software is Matlab® data processing software and Matlab® data processing software is used for data processing and graphic display.

8. The method according to claim 7, wherein the measurement data obtained in said step (c) is used to apply the data fitting toolbox of Matlab® software to perform a two-dimensional plane simulation on the ΔZ data, to get the fitting plane P, to take Diff=ΔZ−P, to get the surface difference data Diff with the amount of tilt removed and to display the graph to obtain the surface error distribution of the toric mirror.

* * * * *